(12) United States Patent
Hayakawa et al.

(10) Patent No.: US 9,142,775 B2
(45) Date of Patent: Sep. 22, 2015

(54) METHOD OF MANUFACTURING SEMICONDUCTOR MEMORY DEVICE

(71) Applicant: Panasonic Corporation, Osaka (JP)

(72) Inventors: Yukio Hayakawa, Kyoto (JP); Atsushi Himeno, Osaka (JP); Hideaki Murase, Osaka (JP); Yoshio Kawashima, Osaka (JP); Takumi Mikawa, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 175 days.

(21) Appl. No.: 13/823,776

(22) PCT Filed: Oct. 9, 2012

(86) PCT No.: PCT/JP2012/006465
§ 371 (c)(1),
(2) Date: Mar. 15, 2013

(87) PCT Pub. No.: WO2013/054506
PCT Pub. Date: Apr. 18, 2013

(65) Prior Publication Data
US 2014/0113430 A1  Apr. 24, 2014

(30) Foreign Application Priority Data

Oct. 11, 2011  (JP) ................. 2011-224279

(51) Int. Cl.
*H01L 45/00* (2006.01)

(52) U.S. Cl.
CPC ............ *H01L 45/1641* (2013.01); *H01L 45/08* (2013.01); *H01L 45/1233* (2013.01); *H01L 45/146* (2013.01); *H01L 45/1625* (2013.01); *H01L 45/1675* (2013.01)

(58) Field of Classification Search
USPC ........................................................ 438/385
See application file for complete search history.

(56) References Cited

U.S. PATENT DOCUMENTS 7,763,399 B2 *  7/2010  Sengupta et al. ................. 430/5
8,022,502 B2     9/2011  Kanzawa et al.
(Continued)

FOREIGN PATENT DOCUMENTS

JP   2010-225872   10/2010
JP   2010-251596   11/2010
(Continued)

OTHER PUBLICATIONS

Berry et al., "Post Etch Residue Removal: Novel Dry Clean Technology Using Densified Fluid Cleaning (DFC)", Paper presented at IITC, Burlington, CA, Jun. 1999, pp. 1-3.*
(Continued)

*Primary Examiner* — Jarrett Stark
*Assistant Examiner* — Charles N Ausar-el
(74) *Attorney, Agent, or Firm* — Wenderoth, Lind & Ponack, L.L.P.

(57) ABSTRACT

A method of manufacturing a semiconductor device according to the present invention includes: forming a lower electrode above a substrate; forming, above the lower electrode, a first variable resistance layer comprising a first metal oxide; forming a step region in the first variable resistance layer by collision of ions excited by plasma; removing residue of the first variable resistance layer created in the forming of the step region; forming a second variable resistance layer which covers the step region of the first variable resistance layer, comprises a second metal oxide having a degree of oxygen deficiency lower than a degree of oxygen deficiency of the first metal oxide, and has a bend on a step formed along an edge of the step region; and forming an upper electrode above the second variable resistance layer.

7 Claims, 15 Drawing Sheets

(56) References Cited

U.S. PATENT DOCUMENTS

| | | | |
|---|---|---|---|
| 8,097,538 B2 | 1/2012 | Koide et al. | |
| 8,437,173 B2 * | 5/2013 | Hayakawa et al. | 365/148 |
| 2009/0283736 A1 | 11/2009 | Kanzawa et al. | |
| 2010/0190313 A1 * | 7/2010 | Kawashima et al. | 438/385 |
| 2010/0225438 A1 * | 9/2010 | Wei et al. | 338/20 |
| 2010/0267233 A1 | 10/2010 | Koide et al. | |
| 2010/0288995 A1 * | 11/2010 | Ozawa et al. | 257/4 |
| 2011/0095255 A1 | 4/2011 | Sumino et al. | |
| 2011/0220863 A1 * | 9/2011 | Mikawa et al. | 257/4 |
| 2011/0294259 A1 | 12/2011 | Kanzawa et al. | |
| 2012/0161095 A1 * | 6/2012 | Mikawa et al. | 257/4 |
| 2013/0140514 A1 * | 6/2013 | Mikawa et al. | 257/4 |

FOREIGN PATENT DOCUMENTS

| | | |
|---|---|---|
| JP | 2011-091325 | 5/2011 |
| WO | 2008/149484 | 12/2008 |
| WO | 2010/079827 | 7/2010 |
| WO | 2011/030559 | 3/2011 |
| WO | WO2011114725 * | 9/2011 |

OTHER PUBLICATIONS

Jolly, "Ion beam Etching and reactive Ion beam etching", Oxford Instruments, Oct. 2003, pp. 1-5.*

International Search Report issued Nov. 27, 2012 in International (PCT) Application No. PCT/JP2012/006465.

* cited by examiner

METHOD OF MANUFACTURING SEMICONDUCTOR MEMORY DEVICE

TECHNICAL FIELD

The present invention relates to a method of manufacturing a semiconductor memory device.

BACKGROUND ART

Recent years have seen increasing high performance in electronic devices such as mobile information devices and information appliances following the development of digital technology. With the increased high performance in these electronic devices, miniaturization and increase in speed of semiconductor memory devices used are rapidly advancing. Among these, application of semiconductor memory devices to large-capacity nonvolatile memories represented by a flash memory is rapidly expanding.

In addition, as a semiconductor memory device to be applied to a next-generation nonvolatile memory to replace the flash memory, research and development on a variable resistance nonvolatile memory device (what is called a variable resistance element) is advancing. Here, variable resistance element refers to an element which has a property in which a resistance value reversibly changes according to electrical signals, and is capable of storing information corresponding to the resistance value in a nonvolatile manner.

For example, Patent Literature (PTL) 1 proposes a variable resistance nonvolatile memory device configured of a variable resistance layer which is interposed between a pair of electrodes and includes, in a stacked structure, a first variable layer comprising a first metal oxide and a second variable layer comprising a second metal oxide having a lower degree of oxygen deficiency than the first metal oxide. Definition of the degree of oxygen deficiency shall be described later.

In PTL 1, it is possible to realize stable resistance changing operation because, according to the variable resistance nonvolatile memory device configured in the above manner, oxidation/reduction reaction of the variable resistance layer selectively occurs in an interface where the second variable resistance layer and an electrode are in contact.

Although capable of realizing stable resistance changing operation, the above-described variable resistance nonvolatile memory device requires processing (hereafter referred to as initial break processing) for forming a filament in the second variable resistance layer, in order to be brought, from the initial state immediately after manufacturing, to a state in which the resistance changing operation is possible.

The initial break processing is performed, for example, by applying, to the variable resistance layer, a voltage pulse having a voltage (hereafter referred to as initial break voltage) that is higher than the voltage required for normal variable resistance changing operation.

Consequently, a variable resistance nonvolatile memory device in which the initial break processing can be achieved with a lower initial break voltage is being studied.

For example, PTL 2 proposes a variable resistance nonvolatile memory device configured of a variable resistance layer which is interposed between a pair of electrodes and includes, in a stacked structure, a first variable layer comprising a first metal oxide and a second variable layer comprising a second metal oxide having a lower degree of oxygen deficiency than the first metal oxide, wherein the surface of the first variable resistance layer has a step, and the second variable resistance layer has a bend above the step.

In PTL 2, initial break processing is possible through the application of a low initial break voltage because, according to the variable resistance nonvolatile memory device configured in the above manner, a bend reflecting the shape of the step of the first variable resistance layer is formed in the second variable resistance layer above the step, and it becomes easy to form a filament centered on such bend.

CITATION LIST

Patent Literature

[PTL 1] International Publication No. 2008/149484
[PTL 2] International Publication No. 2011/030559

SUMMARY OF INVENTION

Technical Problem

However, in the variable resistance nonvolatile memory device in which a step is provided in the first variable resistance layer as disclosed in PTL 2, there are instances in which the second variable resistance layer cannot sufficiently cover the step of the first variable resistance layer. The insufficiency of the covering of the step of the first variable resistance layer by the second variable resistance layer becomes a factor for increasing fluctuation in the characteristics (particularly initial resistance and initial break voltage) of the variable resistance nonvolatile memory device.

The present invention is conceived in view of such circumstances and provides a method of manufacturing a semiconductor memory device including a variable resistance layer including, in a stacked structure, a first variable resistance layer and a second variable resistance layer, which is capable of forming a step in the first variable resistance layer and covering the step with the second variable resistance layer more reliably than in the conventional method.

Solution to Problem

In order to achieve the aforementioned object, a method of manufacturing a semiconductor memory device according to an aspect of the present invention includes: forming a lower electrode above a substrate; forming a first variable resistance layer above the lower electrode, the first variable resistance layer comprising a first metal oxide; forming a step in a top face of the first variable resistance layer by causing ions excited by plasma to collide with a part of the top face of the first variable resistance layer; removing residue of the first variable resistance layer remaining on the step, after the step is formed; forming a second variable resistance layer covering the step of the first variable resistance layer, after the residue is removed, the second variable resistance layer comprising a second metal oxide having a degree of oxygen deficiency lower than a degree of oxygen deficiency of the first metal oxide and having a bend on a surface above the step; and forming an upper electrode above the second variable resistance layer.

Advantageous Effects of Invention

According to the method of manufacturing a semiconductor memory device according to the present invention, the residue of the first metal oxide that is created in the forming of the step of the first variable resistance layer can be removed, and the bend on the surface above the step can be completely covered by the second variable resistance layer, and thus it is possible to provide a variable resistance nonvolatile memory device in which initial break voltage can be lowered and fluctuations in initial break voltage can be suppressed.

It should be noted that, aside from a variable resistance nonvolatile memory device, the method of manufacturing a semiconductor memory device according to the present invention (i) can generally be applied to a semiconductor memory device which has a stacked structure having a step in the main section, and where residue created during the forming of the step becomes a factor for inhibiting operational characteristics, and (ii) can produce the advantageous effect of improving operational characteristics through the removal of residue, in the same manner as when being applied to a variable resistance nonvolatile memory device.

DESCRIPTION OF EMBODIMENTS

Figure 1:
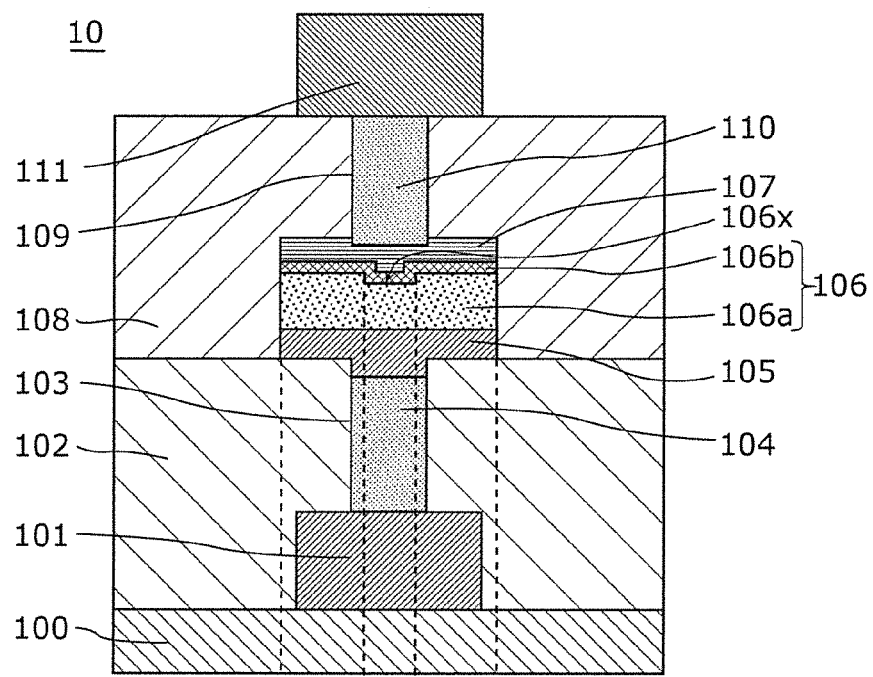
FIG. 1 (a) is a cross-sectional view of a semiconductor memory device formed through a manufacturing method in Embodiment 1, FIG. 1 (b) is a plan view of an upper electrode of the semiconductor memory device.
Figure 1:
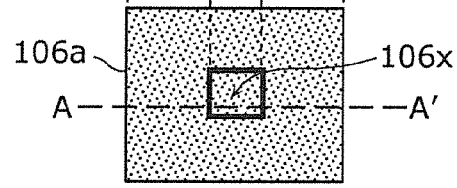

Underlying Knowledge Forming Basis of the Present Disclosure

Through the studies and experiments described below, the inventors found a problem of the conventional method of manufacturing a variable resistance nonvolatile memory device (what is called a variable resistance element) described in the Background Art.

As previously described, in the variable resistance element disclosed in PTL 2, a step is formed in the surface of a first variable resistance layer, and the step is covered by a second variable resistance layer having a lower degree of oxygen deficiency than the first variable resistance memory. Consequently, with the bend formed in the second variable resistance layer as a center, it becomes easy to form a minute local region in which the degree of oxygen deficiency reversibly changes according to the application of electric pulse, and thus the initial break voltage can be reduced.

As a method of forming a step in a substrate surface, dry etching which makes use of plasma is widely used. Generally, the dry etching method mixes a phenomenon in which etching progresses through the chemical reaction between the substrate surface and gas excited by plasma and a phenomenon in which etching progresses by plasma-excited ions colliding with the substrate surface.

In the case of forming a step in the surface of the metal oxide at which the resistance changing operation is performed, it is undesirable to have a dry etching condition in which the percentage for etching progression due to the chemical reaction between the etching gas and the metal oxide surface is high. This is because the product of the reaction with the etching gas accumulates on the surface of the variable resistance layer in which the redox phenomenon of oxygen atoms occurs, and inhibits stable resistance changing operation. In particular, in the case where fluorine gas, which has high reactivity with metal oxides, is used, fluorine atoms which have higher electronegativity than oxygen atoms mix into the metal oxide, and thus the redox phenomenon of the oxygen atoms is inhibited and the resistance changing operation becomes unstable.

On the other hand, in the case of an etching condition in which the percentage for etching progression due to the collision of plasma-excited ions is high, since there is no accumulation of the product of reaction between etching gas and the substrate surface, the redox phenomenon of oxygen atoms is not inhibited, and thus stable resistance changing operation can be obtained. In addition, there is no need to use the highly-reactive fluorine gas, and thus, in principle, fluorine atoms do not mix into the metal oxide. Furthermore, in the case where the plasma-excited ions are inert elements, the ions do not become a factor for inhibiting the redox phenomenon of oxygen atoms even when driven into the metal oxide because the ions are inert elements.

Therefore, for the method of forming a step in the surface of the metal oxide at which the resistance changing operation is performed, it is preferable to have a dry etching condition in which the percentage for the phenomenon of etching progression due to the collision of plasma-excited ions is higher than the percentage for the phenomenon of etching progression due to the chemical reaction.

However, when etching progresses due to the collision of plasma-excited ions, there is a manufacturing problem of the creation of residue made up of the metal oxide that has been sputtered through the collision with the ions. The inventors have focused attention on such residue as a separate factor that inhibits the stable resistance changing operation of the variable resistance element.

Figure 9A:
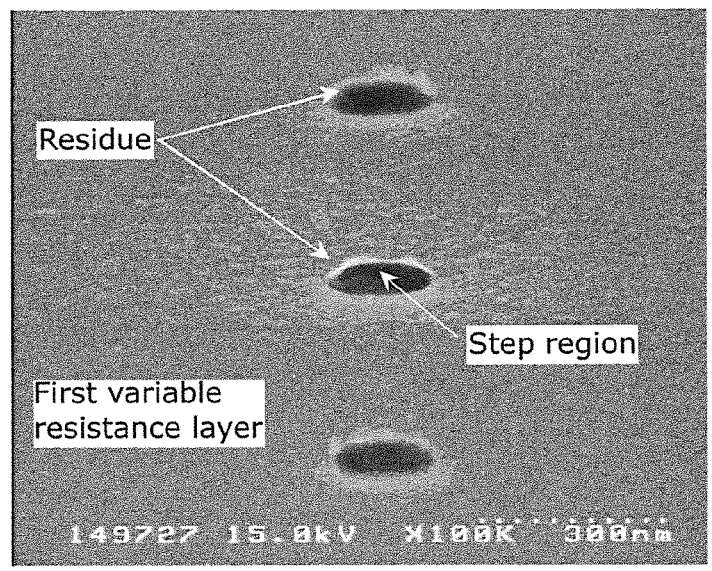
FIG. 9A is an SEM photograph of the surface of a step region formed through a conventional manufacturing method.
Figure 9B:
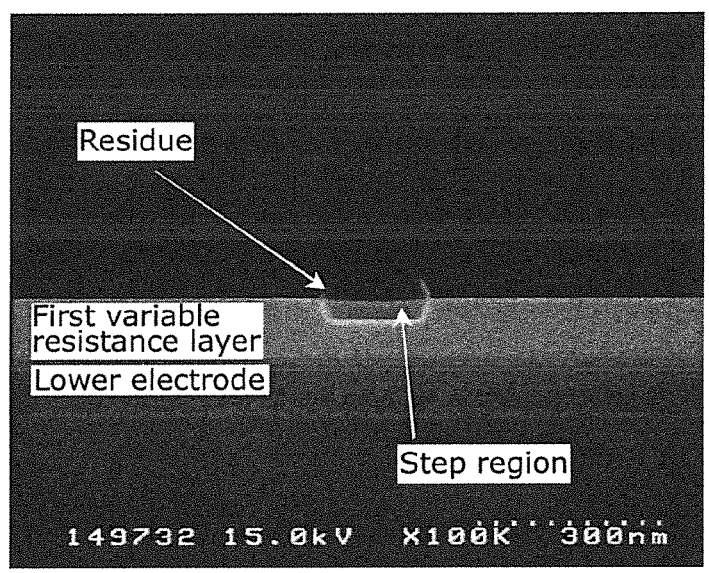
FIG. 9B is an SEM photograph of a cross section of the step region formed through a conventional manufacturing method.

FIG. 9A and FIG. 9B are SEM photographs for the case where a step is formed in the surface of a metal oxide using a mixed gas of argon (Ar) and chlorine with argon as the primary component. They are photographs taken after a resist defining the etching range is peeled off, and thin, flaky residue of the metal oxide can be observed in the edge of the etched region. It is thought that this residue is the remainder of the sputtered metal oxide that has re-adhered to the end face of the resist (that is, the inner circumferential face of the opening provided on the etching range).

When such a residue is left on the step of the first variable resistance layer, the residue inhibits the covering of the step by the second variable resistance layer and becomes a factor for increasing fluctuation in the initial resistance and initial break voltage of the variable resistance element.

Figure 9C:
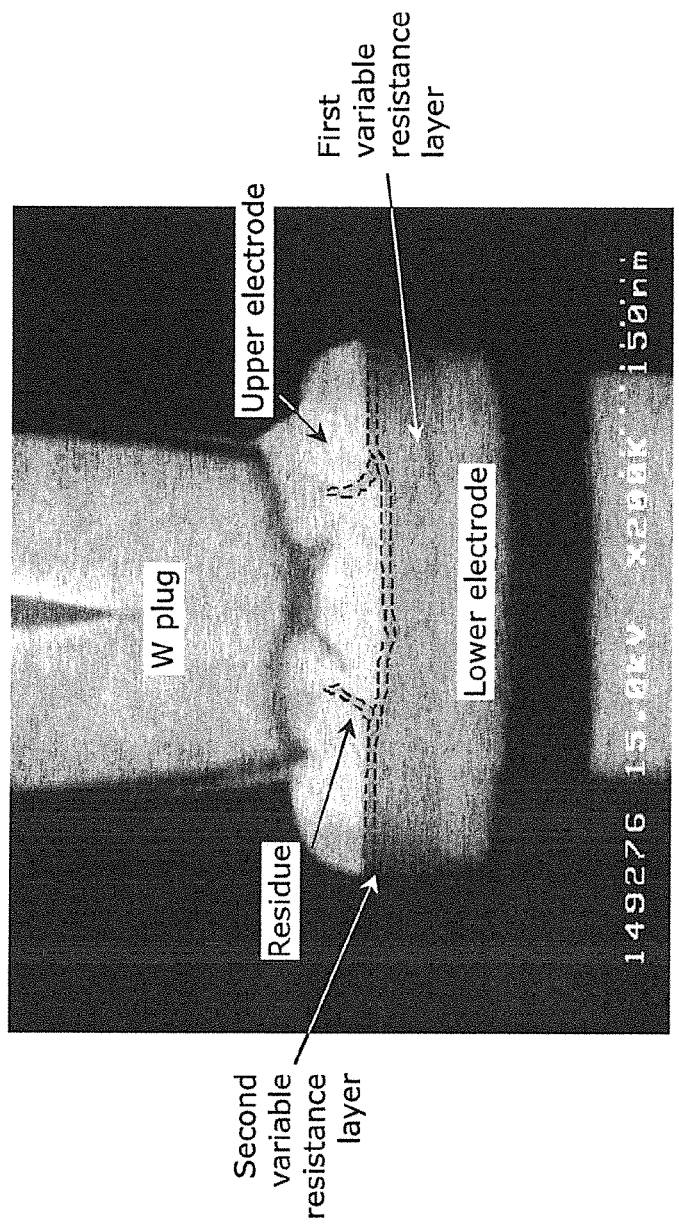
FIG. 9C is an SEM photograph of a cross section of a variable resistance element formed through the conventional manufacturing method.

FIG. 9C is an SEM photograph of a cross section of a variable resistance element in which residue is left behind by the conventional manufacturing method. It can be seen that, due to the residue, the second variable resistance layer and the upper electrode are not able to sufficiently cover the step.

In order to solve such a problem, a method of manufacturing a semiconductor memory device according to an aspect of the present invention includes: forming a lower electrode above a substrate; forming a first variable resistance layer above the lower electrode, the first variable resistance layer comprising a first metal oxide; forming a step in a top face of the first variable resistance layer by causing ions excited by plasma to collide with a part of the top face of the first variable resistance layer; removing residue of the first variable resistance layer remaining on the step, after the step is formed; forming a second variable resistance layer covering the step of the first variable resistance layer, after the residue is removed, the second variable resistance layer comprising a second metal oxide having a degree of oxygen deficiency lower than a degree of oxygen deficiency of the first metal oxide and having a bend on a surface above the step; and forming an upper electrode above the second variable resistance layer.

Here, the residue may remain as flakes on the step, after the step is formed, and, in the removing of residue, the residue of the first variable resistance layer remaining on the step may be removed while etching the top face of the first variable resistance layer.

Here, in the forming of a step, the part of the top face of the first variable resistance layer may be removed through collision with the ions, and the step may be formed at a border between the removed part of the top face of the first variable resistance layer and a remaining part of the top face that is not removed.

By adopting such a manufacturing method, the residue of the first metal oxide that is created in the forming of the step of the first variable resistance layer can be removed, and the bend on the surface above the step can be completely covered by the second variable resistance layer, and thus it is possible to realize a semiconductor memory device in which initial break voltage can be lowered and fluctuations in initial break voltage can be suppressed.

Furthermore, in the forming of a step, the collision with the ions may be performed in an inert gas or a mixed gas which has an inert gas as a primary component and does not contain fluorine.

By adopting such a manufacturing method, mixing of fluorine atoms into the first variable resistance layer does not occur in principle, and thus it is possible to realize a semiconductor memory device in which reliability of the resistance changing operation is improved without inhibiting the redox phenomenon of oxygen atoms.

Furthermore, in the removing of residue, the residue may be etched using a solution including any of ammonia, fluorine, and chlorine.

By adopting such a manufacturing method, the thin, flakes of residue can be isotropically etched, and etching advances in a direction parallel to the substrate, and thus the residue can be removed with a small amount of etching. Therefore, because alteration of the shape of the bend of the second variable resistance layer occurring in the removing of the residue can be minimized and etching damage due to plasma does not occur, it is possible to realize a semiconductor memory device in which initial break voltage is lowered and fluctuations in initial break voltage is suppressed.

Furthermore, the method of manufacturing a semiconductor memory device may further include terminating dangling bonds of the first metal oxide with oxygen, after the residue is removed.

By adopting such a manufacturing method, the dangling bonds of the first metal oxide are terminated with oxygen, and thus, even with exposure to the atmosphere after the residue of the first variable resistance layer is removed, formation of a natural oxide film can be suppressed, and thus fluctuation in the initial resistance value and break voltage of the semiconductor memory device can be reduced.

Furthermore, in the terminating of dangling bonds with oxygen, the dangling bonds of the first metal oxide may be terminated using a solution including either hydrogen peroxide or ozone.

By adopting such a manufacturing method, even the side face of the step region can be uniformly terminated with oxygen without being influenced by the shape (dimensions and depth) of the step formed in the surface of the first variable resistance layer, and thus fluctuation in initial break voltage can be reduced.

Furthermore, the method of manufacturing a semiconductor memory device may further include forming a third variable resistance layer above the first variable resistance layer before the step is formed, the third variable resistance layer comprising a third metal oxide having a degree of oxygen deficiency lower than a degree of oxygen deficiency of the first metal oxide, wherein, in the forming of a step, the step may be formed by forming an opening penetrating through the third variable resistance layer by causing the ions to collide with a part of a top face of the third variable resistance layer, and causing the ions to collide with the first variable resistance layer exposed at a bottom of the opening, the part being located above the part of the top face of the first variable resistance layer.

By adopting such a manufacturing method, only the second variable resistance layer, out of the second variable resistance layer and the third variable resistance layer, is formed in the step region of the first variable resistance layer, and the second variable resistance layer and the third variable resistance layer are formed in the regions of the first variable resistance layer other than the step region. Therefore, the metal oxide having a lower degree of oxygen deficiency and higher resistance is formed more thinly above the step region compared to the other parts, and thus the current flowing in the semiconductor memory device at the time of the initial break operation converges in the thin step region. As a result, forming of a filament in the step region is facilitated, and thus initial break voltage can be lowered.

Hereinafter, embodiments of the present invention shall be described with reference to the Drawings. It should be noted that identical components are assigned the same reference signs and their description shall not be repeated. Furthermore, the shapes of the transistors, nonvolatile semiconductor memory device, and so on, are merely schematic, and their number and so on, are set merely for the sake of convenient illustration. In other words, each of the subsequently-described embodiments shows one specific preferred example of the present invention. The numerical values, shapes, materials, structural components, the arrangement and connection of the structural components, steps, the processing order of the steps, etc. shown in the following exemplary embodiments are mere examples, and therefore do not limit the scope of the appended claims and their equivalents. Furthermore, among the structural components in the following exemplary embodiments, components not recited in any one of the independent claims are described as arbitrary structural components included in a more preferable form.

Embodiment 1

FIGS. 1 (*a*) and (*b*) respectively show an example of a cross-sectional view and a plan view of a semiconductor memory device 10 manufactured through a method of manufacturing a semiconductor memory device according to Embodiment 1 of the present invention. The cross-sectional view in FIG. 1 (*a*) corresponds to the cross section defined by a line A to A' in the plan view in FIG. 1 (*b*). As an example, the semiconductor memory device 10 is shown as a variable resistance nonvolatile memory device (what is called a variable resistance element).

In the semiconductor memory device 10, a variable resistance layer 106 is interposed between a lower electrode 105 and an upper electrode 107, and is a layer having a resistance value that reversibly changes based on an electrical signal applied between the lower electrode 105 and the upper electrode 107. For example, the variable resistance layer 106 is a layer that reversibly transitions between a high resistance state and a low resistance state according to the polarity of the voltage applied between the lower electrode 105 and the upper electrode 107. Furthermore, the variable resistance layer 106 includes, in a stacked structure, at least the two layers of a first variable resistance layer 106*a* connected to the lower electrode 105, and a second variable resistance layer 106*b* connected to the upper electrode 107.

The first variable resistance layer 106*a* comprises a first metal oxide and the second variable resistance layer 106*b* comprises a second metal oxide having a lower degree of oxygen deficiency than the first metal oxide. A minute local region having a degree of oxygen deficiency that reversibly changes according to the application of an electric pulse is formed in the second variable resistance layer 106*b*. It is thought that the local region includes a filament configured from an oxygen defect site.

Here, degree of oxygen deficiency refers to the percentage of deficient oxygen with respect to the amount of oxygen comprising an oxide of the stoichiometric composition (in the case where there are plural stoichiometric compositions, the stoichiometric composition having the highest resistance value among the stoichiometric compositions) in the metal oxide. Compared to a metal oxide with another composition, a metal oxide having a stoichiometric composition is more stable and has a higher resistance value.

For example, when the metal is tantalum (Ta), the oxide having the stoichiometric composition according to the above-described definition is $Ta_2O_5$, and thus can be expressed as $TaO_{2.5}$. The degree of oxygen deficiency of $TaO_{2.5}$ is 0%, and the degree of oxygen deficiency of $TaO_{1.5}$ becomes: degree of oxygen deficiency=(2.5−1.5)/2.5=40%. Furthermore, a metal oxide having excess oxygen has a degree of oxygen deficiency with a negative value. It should be noted that in this Description, unless stated otherwise, the degree of oxygen deficiency includes positive values, 0 (zero), and negative values.

An oxide having a lower degree of oxygen deficiency has a higher resistance value since it is closer to an oxide having a stoichiometric composition, and an oxide having a higher degree of oxygen deficiency has a lower resistance value since it is closer to the metal included in the oxide.

Oxygen content atomic percentage is the percentage of the total number of atoms occupied by oxygen atoms. For example, the oxygen content atomic percentage of $Ta_2O_5$ is the percentage of the total number of atoms occupied by oxygen atoms (O/(Ta+O)), and becomes 71.4 atm %. Therefore, a tantalum oxide has an oxygen content atomic percentage greater than 0 and less than 71.4 atm %. For example, when the metal included in a first metal oxide layer and the metal included in a second metal oxide layer are of the same type, the oxygen content atomic percentage is in a correspondence relation with the degree of oxygen deficiency. In other words, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

Figure 2A:
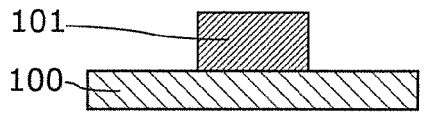
FIG. 2A is a cross-sectional view illustrating a method of manufacturing a main section of the semiconductor memory device in Embodiment 1.
Figure 2B:
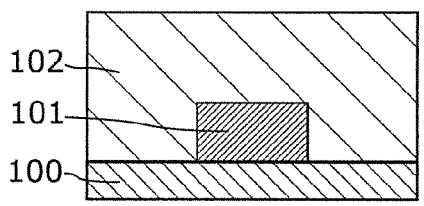
FIG. 2B is a cross-sectional view illustrating the method of manufacturing the main section of the semiconductor memory device in Embodiment 1.
Figure 2C:
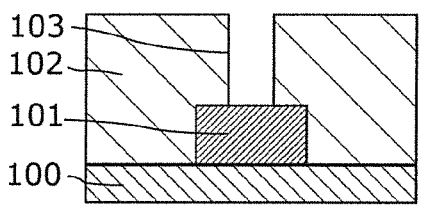
FIG. 2C is a cross-sectional view illustrating the method of manufacturing the main section of the semiconductor memory device in Embodiment 1.
Figure 2D:
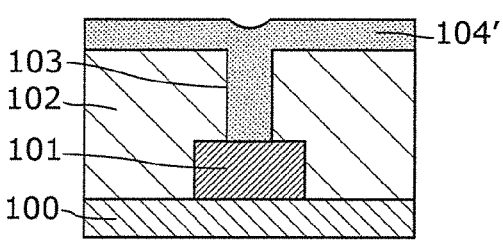
FIG. 2D is a cross-sectional view illustrating the method of manufacturing the main section of the semiconductor memory device in Embodiment 1.
Figure 2E:
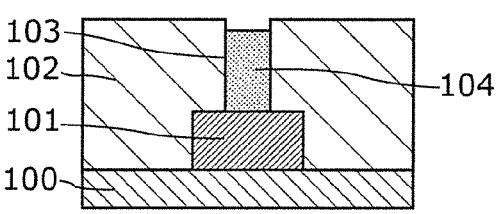
FIG. 2E is a cross-sectional view illustrating the method of manufacturing the main section of the semiconductor memory device in Embodiment 1.
Figure 2F:
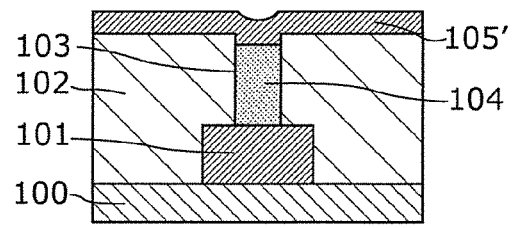
FIG. 2F is a cross-sectional view illustrating the method of manufacturing the main section of the semiconductor memory device in Embodiment 1.
Figure 2G:
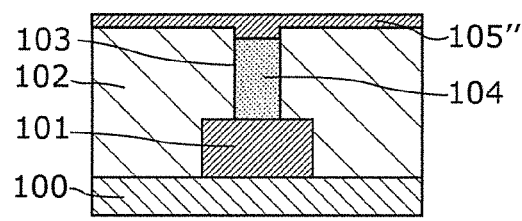
FIG. 2G is a cross-sectional view illustrating the method of manufacturing the main section of the semiconductor memory device in Embodiment 1.
Figure 2H:
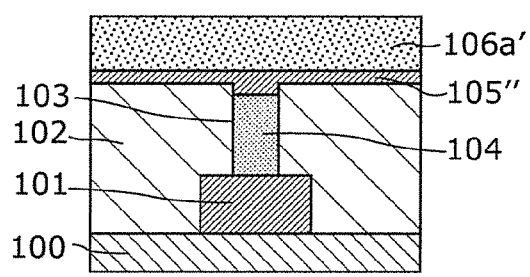
FIG. 2H is a cross-sectional view illustrating the method of manufacturing the main section of the semiconductor memory device in Embodiment 1.
Figure 2I:
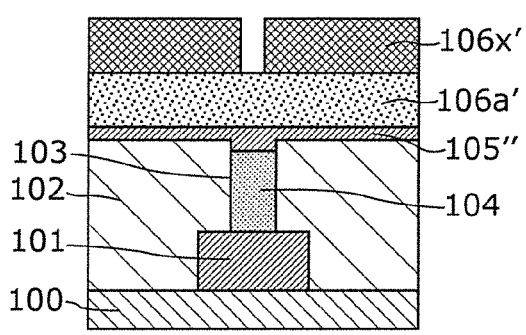
FIG. 2I is a cross-sectional view illustrating the method of manufacturing the main section of the semiconductor memory device in Embodiment 1.
Figure 2J:
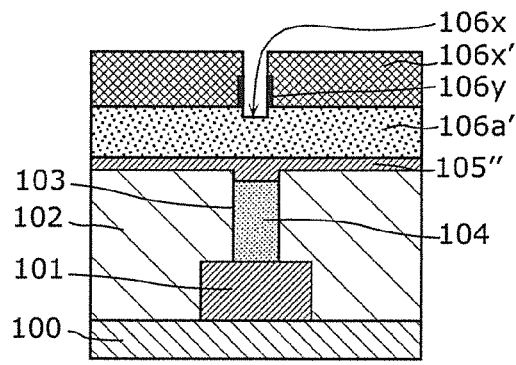
FIG. 2J is a cross-sectional view illustrating the method of manufacturing the main section of the semiconductor memory device in Embodiment 1.
Figure 2K:
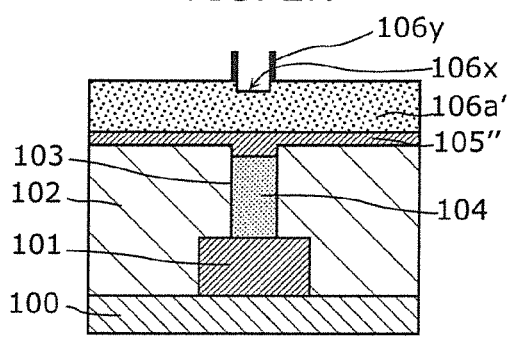
FIG. 2K is a cross-sectional view for describing a problem in a conventional method of manufacturing a semiconductor memory device as a comparative example.
Figure 2L:
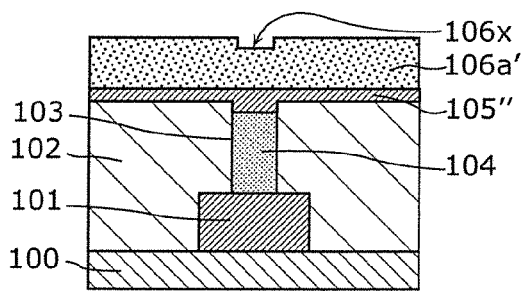
FIG. 2L is a cross-sectional view illustrating the method of manufacturing the main section of the semiconductor memory device in Embodiment 1.
Figure 2M:
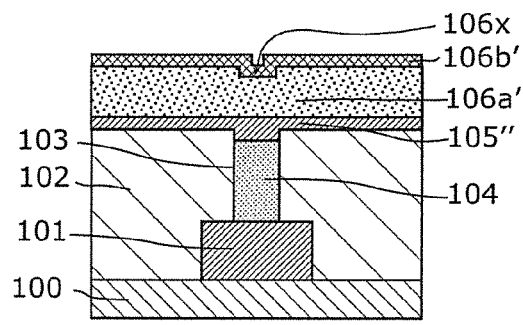
FIG. 2M is a cross-sectional view illustrating the method of manufacturing the main section of the semiconductor memory device in Embodiment 1.
Figure 2N:
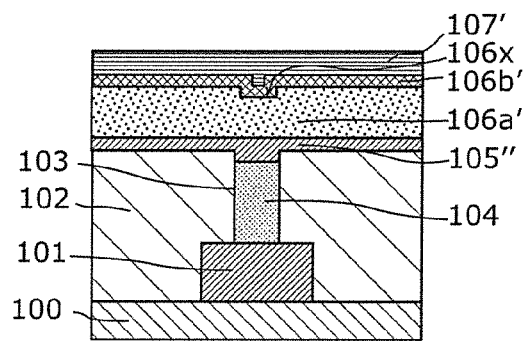
FIG. 2N is a cross-sectional view illustrating the method of manufacturing the main section of the semiconductor memory device in Embodiment 1.
Figure 2O:
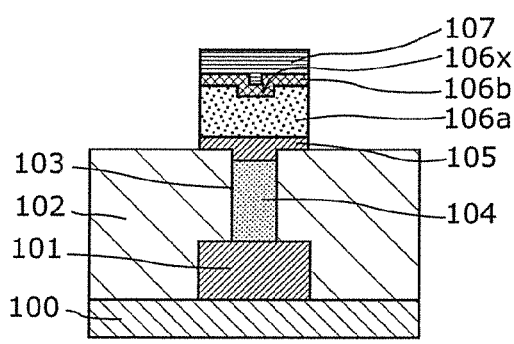
FIG. 2O is a cross-sectional view illustrating the method of manufacturing the main section of the semiconductor memory device in Embodiment 1.

FIG. 2A to FIG. 2O are cross-sectional views illustrating the method of manufacturing a semiconductor memory device in Embodiment 1 of the present invention.

First, as shown in FIG. 2A, in a process of forming a first line 101, the first line 101 is formed by forming a conductive layer (thickness: at least 400 nm and at most 600 nm) comprising aluminum, on a substrate 100 in which a transistor, a lower layer line, and so on are formed, and performing patterning on the conductive layer.

Next, as shown in FIG. 2B, in a process of forming a first interlayer insulating layer 102, the first interlayer insulating layer 102 (for example, thickness: at least 500 nm and at most 1,000 nm) is formed by forming an insulating layer on the substrate 100 and covering the first line 101, and subsequently planarizing the surface of the insulating layer.

A plasma TEOS film can be used for the first interlayer insulating layer 102. Furthermore, in order to reduce the amount of parasitic capacitance between lines, a low-k material such as a fluorine-containing oxide (for example, FSG) and so on can be used for the first interlayer insulating layer 102.

Next, as shown in FIG. 2C, in a process of forming a first contact hole 103, patterning is performed on the first interlayer insulating layer 102, using the desired mask, to form the first contact hole 103 (for example, diameter: at least 50 nm and at most 300 nm) which penetrates through the first interlayer insulating layer 102 and connecting with the first line 101.

Here, when the width of the first line 101 is less than the diameter of the first contact hole 103, the area in which the first line 101 and a first contact plug 104 come into contact changes due to the impact of mask misalignment, and thus, for example, cell current fluctuates. From the point of view of preventing such an inconvenience, the width of the first line 101 is made greater than the diameter of the first contact hole 103.

Next, in a process of forming the first contact plug 104, first, after an adhesion layer for an underlying layer and a TiN/Ti layer (for example, thickness: at least 5 nm and at most 30 nm) which functions as a diffusion barrier are formed using the sputtering method, tungsten W (for example, thickness: at least 200 nm and at most 400 nm) which serves as the primary component is formed above such layers using the CVD method.

As a result, as shown in FIG. 2D, the first contact hole 103 is filled with a conductive layer 104' which has the stacked structure of the adhesion layer, diffusion barrier, and main layer, and which is to become the first contact plug 104.

However, a depression (for example, depth: at least 5 nm and at most 100 nm) which reflects the shape of the base is created in the top face of the conductive layer 104' above the first contact hole 103.

Next, as shown in FIG. 2E, in the process of forming the first contact plug 104, planarization polishing using a chemical mechanical polishing method (CMP method) is performed on the entire surface of the wafer to remove the unnecessary conductive material 104' on the first interlayer insulating layer 102, and thus form the first contact plug 104 inside the first contact hole 103.

At this time, the top face of the first contact plug 104 and the top face of the first interlayer insulating layer 102 are not continuous, and a recess (for example, depth: at least 5 nm and at most 50 nm) is created in the non-continuous part. Such a recess is created because, as an insulator and a conductor, respectively, the materials comprised in the first interlayer insulating layer 102 and the first contact plug 104 are necessarily different, and thus their polishing rates in the CMP method are different. This is an unavoidable phenomenon which necessarily occurs when using different types of materials.

Next, as shown in FIG. 2F, in a process of forming a the lower electrode 105, a conductive layer 105' (for example, thickness: at least 50 nm and at most 200 nm) comprising a tantalum nitride and which later becomes the lower electrode 105 is formed with the sputtering method, on the first interlayer insulating layer 102 and covering the first contact plug 104.

The conductive layer 105' is also formed in the part of the recess created above the first contact plug 104 inside the first contact hole 103. Furthermore, in the same manner as before, a depression which reflects the shape of the base is created in the top face of the conductive layer 105' above the first contact plug 104.

Next, as shown in FIG. 2G, in a process of forming the lower electrode 105, planarization polishing using the chemical mechanical polishing method (CMP method) is performed on the entire surface of the wafer to form a conductive layer 105'' (for example, thickness: at least 20 nm and at most 100 nm) which becomes the lower electrode 105 after patterning.

The point of this process is to perform planarization polishing on the conductive layer 105' until the above-described depression created in FIG. 2F disappears, and to leave behind the entire conductive layer 105''. According to such a manufacturing method, the step created on the first contact plug 4 is not transferred onto the surface of the conductive layer 105'', and thus there is extreme flatness throughout the entire surface of the lower electrode, and a continuous plane can be maintained. Such a flat continuous plane can be maintained because, unlike when the contact plug 104 is formed, what is polished is always the same type of material because the polishing of the conductive layer 105'' is stopped along the way, and thus, in principle, the difference in polishing rates in the CMP method can be avoided.

Next, as shown in FIG. 2H, in a process of forming the first variable resistance layer 106a, a first variable resistance layer 106a' comprising a metal oxide is formed on the conductive layer 105''.

The first variable resistance layer 106a' may be formed with what is called a reactive sputtering method in which sputtering is performed on a tantalum target in an argon and oxygen gas atmosphere. As an example, the stoichiometric composition of the first variable resistance layer 106a' may be $TaO_x$ ($0.8 \le x \le 1.9$, or at least 44.4 atm % and at most 65.5 atm % in terms of oxygen content atomic percentage), resistivity may be at least 2 mΩcm and at most 50 mΩcm, and film thickness may be at least 20 nm and at most 100 nm.

Next, as shown in FIG. 2I, in a process of forming an opening in a resist 106x', after the resist 106x' is applied, an opening that reaches the first variable resistance layer 106a' is formed in a position corresponding to a step region of the resist 106x' using a photolithography technique using a desired mask.

Next, as shown in FIG. 2J, in a process of forming a step region 106x in the first variable resistance layer 106a', the step region 106x having a depth of, for example, at least 1 nm and at most 30 nm may be formed by causing plasma-excited ions to collide with the first variable resistance layer 106a' from the opening of the resist 106x'.

In FIG. 2J, the step region 106x is shown, as an example, as a depression in the first variable resistance layer 106a', formed at the bottom of the opening. A step is formed along the edge of the step region 106x.

Since an inert gas, such as Ar, which does not contain fluorine (F) is used as the etching gas in the forming of the step region 106x, in principle, fluorine (F), and so on, does not enter the first variable resistance layer 106a' and cause deterioration of the film property of the variable resistance layer.

Here, a mixed gas of chlorine with argon as the primary component is excited using plasma, and the excited ions are made to collide with the surface of the first variable resistance layer 106a' to thereby form the step region 106x in the first variable resistance layer 106a'. At this time, the tantalum oxide used for the sputtered first variable resistance layer 106a' adheres to the end face of the resist 106x' (that is, the inner circumferential face of the opening).

When the resist 106x' is peeled off without removing this extraneous matter, residue 106y in the form of flakes remains in the edge of the step region 106x, as shown in FIG. 2K. As pointed out in the "Technical Problem" section, the residue 106y inhibits the covering of the step by the second variable resistance layer and becomes a factor for increasing fluctuation in the initial resistance and initial break voltage of the variable resistance element.

Thus, in the method of manufacturing a semiconductor memory device in Embodiment 1, as shown in FIG. 2L, in a process of removing the residue 106y adhering to the surface of the first variable resistance layer, the flaky residue 106y is isotropically-etched using an ammonia hydroxide/hydrogen peroxide solution.

The ammonia hydroxide/hydrogen peroxide mixture (APM) used here is a mixture of ammonia ($NH_4OH$), hydrogen peroxide ($H_2O_2$), and water ($H_2O$), and the mixing ratio of the mixture may be, as an example, ammonia:hydrogen peroxide:water=1:a:b (where, $1 \leq a \leq 10$ and $1 \leq b \leq 100$). The etching rate of the ammonia hydroxide/hydrogen peroxide mixture solution with respect to the material used for the first variable resistance layer 106a' may be approximately at least 0.01 nm/min and at most 1.0 nm/min. This is in order to remove the residue 106y without etching the first variable resistance layer 106a' as much as possible.

Figure 5A:
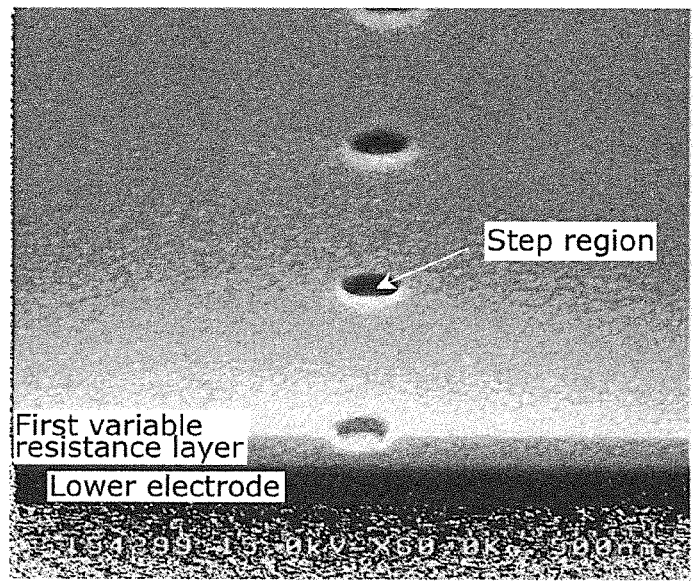
FIG. 5A is an SEM photograph of the surface of a step region formed through the manufacturing method in Embodiment 1.
Figure 5B:
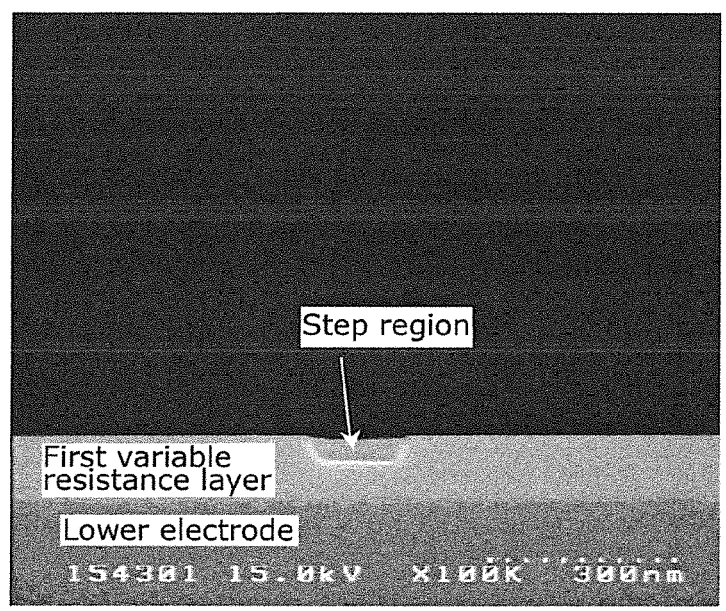
FIG. 5B is an SEM photograph of the cross section of the step region formed through the manufacturing method in Embodiment 1.

FIG. 5A and FIG. 5B show an SEM photograph for the case where flaky residue is removed using an ammonia hydroxide/hydrogen peroxide mixture solution. The flaky residue 106y (FIG. 9A, FIG. 9B) created in the conventional manufacturing method is completely removed. Furthermore, for removing of the residue 106y, any solution capable of isotropically-etching the first variable resistance layer 106a' is acceptable, and even a dilute hydrofluoric acid (DHF) solution or a dilute hydrochloric acid (HCl) solution is acceptable.

Next, after removing the residue 106y, the peeling-off of the resist 106x' using a sulfuric acid hydrogen peroxide mixture (SPM) and termination of the dangling bonds of the first variable resistance layer 106a' with oxygen are performed simultaneously. The SPM solution used here is a mixture of sulfuric acid ($H_2SO_4$) and hydrogen peroxide solution ($H_2O_2$), and the mixture ratio of the mixture may be, as an example, sulfuric acid:hydrogen peroxide solution=1:c (where, $1 \leq c \leq 10$). Furthermore, the termination of the dangling bonds of the surface of the first variable resistance layer 106a with oxygen may be performed using ozone water or hydrogen peroxide water Next, as shown in FIG. 2M, in a process of forming the second variable resistance layer 106b, a second variable resistance layer 106b' having a lower degree of oxygen deficiency than the first variable resistance layer 106a' is formed on the first variable resistance layer 106a'.

In the same manner as in the first variable resistance layer 106a', the second variable resistance layer 106b' may be formed with the reactive sputtering method in which sputtering is performed on a tantalum target in an oxygen gas atmosphere. As an example, the composition of the second variable resistance layer 106b' may be $TaO_y$, ($2.1 \leq y \leq 2.5$, or at least 67.7 atm % and at most 71.4 atm % in terms of oxygen content atomic percentage), resistivity may be at least $10^7$ mΩcm, and film thickness may be at least 1 nm and at most 8 nm.

A bend of the second variable resistance layer 106b' is formed above the step formed at the edge of the step region 106x in the surface of the first variable resistance layer 106a'.

Here, the film thickness of the bend of the second variable resistance layer 106b' can be adjusted to be thin according to the depth of the base of the step region 106x, and thus a thin-film part can be formed locally in a stable manner. Furthermore, compared to the flat part of the second variable resistance layer 106b', the film property tends to become sparse in the bend of the second variable resistance layer 106b', and thus a film that facilitates filament forming can be realized.

As previously described, the process of forming the second variable resistance layer 106b may be performed using the reactive sputtering method in which sputtering is performed on a tantalum oxide target in an oxygen gas atmosphere, and plasma oxidation may be performed on the tantalum oxide in an atmosphere including oxygen. In the case of forming in the above manner, there are cases ($TaO_y$, $2.5 < y$) where more oxygen than in the stoichiometric composition is included.

Next, as shown in FIG. 2N, in a process of forming the upper electrode 107, a conductive layer 107', which comprises a noble metal (platinum, iridium, palladium, and so on) and becomes the upper electrode 107 after patterning, is formed on the second variable resistance layer 106b'.

Next, as shown in FIG. 2O, in a process of forming the variable resistance element, patterning using the desired mask is performed on a conductive layer 105", the first variable resistance layer 106a', the second variable resistance layer 106b', and the conductive layer 107' shown in FIG. 2N to form the variable resistance element in which the variable resistance layer 106 configured of the stacked layers of the first variable resistance layer 106a and the second variable resistance layer 106b is held between the lower electrode 105 and the upper electrode 107.

Since etching is difficult to perform on a noble metal and the like which is representative of materials having high standard electrode potential, when a noble metal is used for the upper electrode, the variable resistance element can also be formed with such upper electrode as a hard mask. Although, in the present process, patterning is performed collectively using the same mask, patterning may be performed on a per layer basis.

Lastly, a second interlayer insulating layer 108 (for example, thickness: at least 500 nm and at most 1000 nm) is formed covering the variable resistance element, and a second contact hole 109 and a second contact plug 110 are formed according to the same manufacturing method as in FIG. 2B and FIG. 2C. Subsequently, a second line 111 is formed covering the second contact plug 110, and the semiconductor memory device 10 shown in FIG. 1 (a) is completed.

By using the above-described manufacturing method, the residue created at the time of forming the step of the variable resistance layer can be completely removed and the bend above the step can be covered by the second variable resistance layer, and thus it becomes possible to perform the initial break processing with a low voltage. Furthermore, through oxygen termination after forming the step in the surface of the first variable resistance layer, the formation of a natural oxide film can be suppressed even with exposure to the atmosphere, the initial resistance value can be stabilized, and the fluctuation in initial break voltage can be suppressed.

Figure 6A:
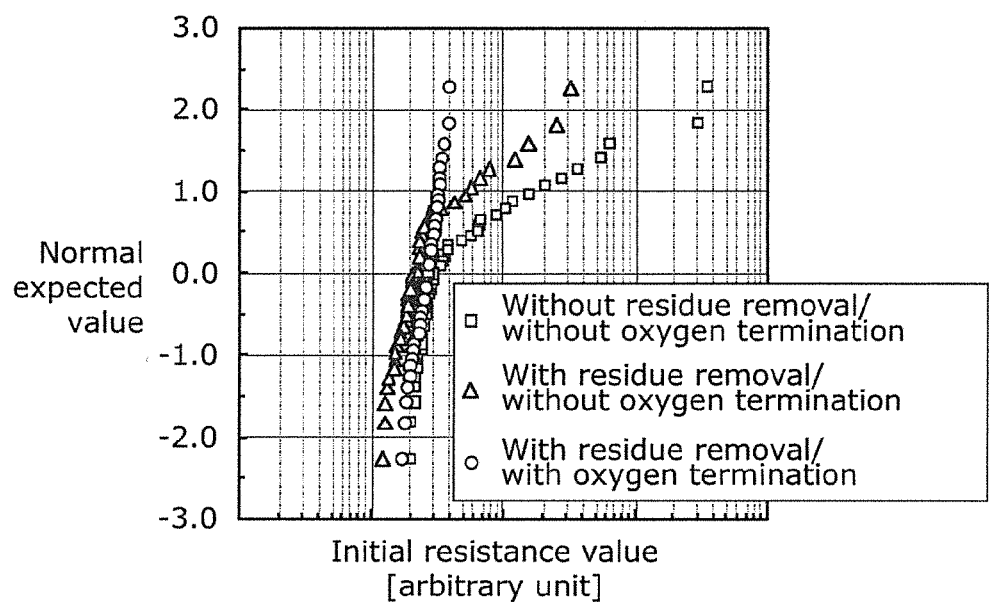
FIG. 6A is a graph showing the distribution of the initial resistance value of a semiconductor memory device formed through a first manufacturing method according to the present invention.
Figure 6B:
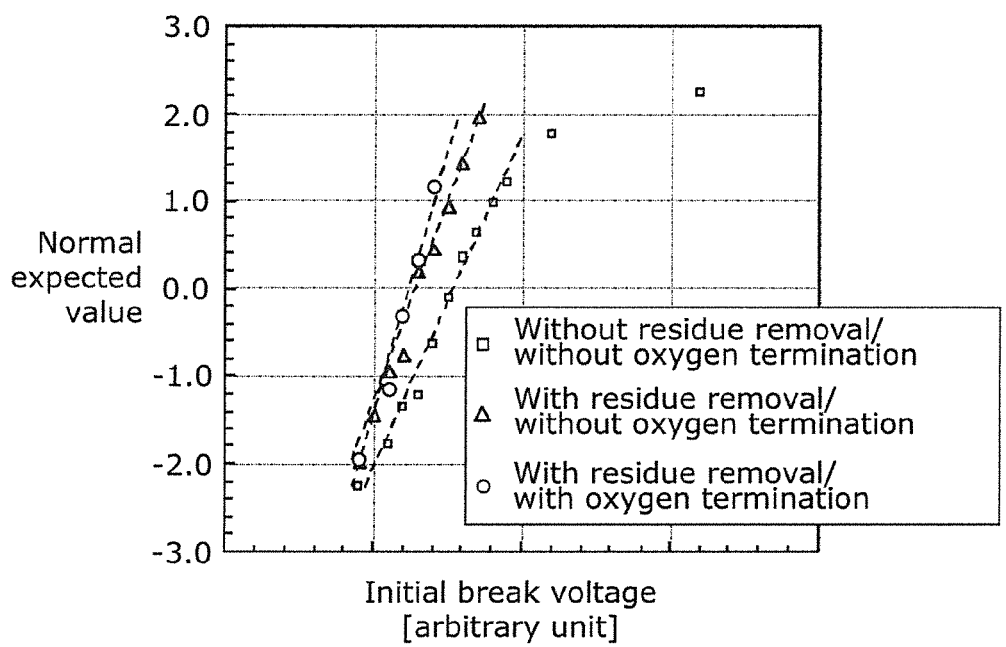
FIG. 6B is a graph showing the distribution of the initial break value of the first manufacturing method according to the present invention.

FIG. 6A shows the initial resistance values when residue removal and oxygen termination after step forming are performed, and FIG. 6B shows the initial break voltages thereof. It can be seen that, by removing the residue, the fluctuation in the initial resistance value and the fluctuation in the initial break voltage are improved. Furthermore, by terminating the dangling bonds of the surface of the first metal oxide with oxygen after the residue removal, the fluctuation in the initial resistance value is further reduced and the suppression of initial break voltage fluctuation can be improved.

Therefore, lowering the initial break voltage and suppressing fluctuation therein can both be achieved, and the miniaturization as well as increasing of capacity of memories can be realized.

Although exemplification is carried above with the variable resistance layer 106 comprising a tantalum oxide, a metal other than tantalum may be used for the metal included in the variable resistance layer 106. For the metal included in the variable resistance layer 106, a transition metal or aluminum (Al) can be used. For a transition metal, it is possible to use tantalum (Ta), titanium (Ti), hafnium (Hf), zirconium (Zr), niobium (Nb), tungsten (W), nickel (Ni), and so on. Since the transition metal can have plural oxidation states, different resistance states can be realized through redox reaction.

For example, in the case of using a hafnium oxide for the variable resistance layer 106, the resistance value of the variable resistance layer 106 can be rapidly changed in a stable manner when, in the case where the composition of the first variable resistance layer 106a is $HfO_x$, x is at least 0.9 and at most 1.6, and when, in the case where the composition of the second variable resistance layer 106b is $HfO_y$, y is larger than the value of x. In this case, the film thickness of the second variable resistance layer 106b may be at least 3 nm and at most 4 nm.

Furthermore, in the case of using a zirconium oxide in the variable resistance layer 106, the resistance value of the variable resistance layer 106 can be rapidly changed in a stable manner when, in the case where the composition of the first variable resistance layer 106a is $ZrO_x$, x is at least 0.9 and at most 1.4, and when, in the case where the composition of the second variable resistance layer 106b is $ZrO_y$, y is larger than the value of x. In this case, the film thickness of the second variable resistance layer 106b may be at least 1 nm and at most 5 nm.

Different metals may be used for the first metal included in the first metal oxide forming the first variable resistance layer 106a and the second metal included in the second metal oxide forming the second variable resistance layer 106b. In this case, the second metal oxide may have a lower degree of oxygen deficiency, that is, a higher resistance, than the first metal oxide. By adopting such a configuration, more of the voltage applied between the lower electrode 105 and the upper electrode 107 at the time of resistance changing is distributed to the second variable resistance layer 106b, and thus it is becomes possible to more easily cause the redox reaction occurring in the second variable resistance layer 106b.

Furthermore, when using mutually different materials for the first metal and the second metal, the standard electrode potential of the second metal may be lower than the standard electrode potential of the first metal. The standard electrode potential indicates a property in which resistance to oxidation is greater with a higher value. Accordingly, the occurrence of the redox reaction is facilitated in the second variable resistance layer 106b comprising the second metal oxide having a relatively low standard electrode potential.

It should be noted that, with regard to the resistance change phenomenon, it is thought that the resistance value (degree of oxygen deficiency) of the minute local region formed inside the second variable resistance layer 106b having a high resistance changes because a redox reaction occurs in the local region and the filament (conduction path) changes.

For example, by using a tantalum oxide for the first metal oxide and using a titanium oxide ($TiO_2$) for the second metal oxide, stable resistance changing operation arises. Titanium (standard electrode potential=−1.63 eV) is a material having a lower standard electrode potential than tantalum (standard electrode potential=−0.6 eV).

In this manner, by using an oxide of a metal having a lower standard electrode potential than the first metal oxide for the second metal oxide, the redox reaction occurs more easily in the second variable resistance layer 106b.

As other combinations, an aluminum oxide ($Al_2O_3$) can be used for the second metal oxide. For example, a tantalum oxide ($TaO_x$) may be used for the first metal oxide, and an aluminum oxide ($Al_2O_3$) can be used for the second metal oxide.

It is thought that, for all the resistance change phenomena in the variable resistance films having the stacked structure as described above, the resistance value of the minute local region formed inside the second variable resistance layer 106b having a high resistance changes because a redox reaction occurs in the local region and the filament (conduction path) inside the local region changes.

Specifically, when a voltage that is positive with respect to the voltage of the lower electrode 105 is applied to the upper electrode 107 connected to the second variable resistance layer 106b, the oxygen ions in the variable resistance layer 106 are pulled toward the second variable resistance layer 106b-side. With this, a redox reaction occurs in the minute local region formed in the second variable resistance layer 106b, and the degree of oxygen deficiency decreases. As a result, it is though that it becomes difficult for the filament inside the local region to connect, and the resistance value of the local region increases.

Conversely, when a voltage that is negative with respect to the voltage of the lower electrode 105 is applied to the upper electrode 107 connected to the second variable resistance layer 106b, the oxygen ions in the second variable resistance layer 106b are pushed toward the first variable resistance layer 106a-side. With this, a redox reaction occurs in the minute local region formed in the second variable resistance layer 106b, and the degree of oxygen deficiency increases. As a result, it is thought that it becomes easy for the filament inside the local region to connect, and the resistance value of the local region decreases.

The upper electrode 107 connected to the second variable resistance layer 106b having a lower degree of oxygen deficiency comprises a material, such as platinum (pt), iridium (Ir), palladium (Pd), which has a higher standard electrode potential compared to the metal included in the second variable resistance layer 106b and the material used for the lower electrode 105. Furthermore, a first electrode connected to the first metal oxide having a higher degree of oxygen deficiency may comprise a material, such as tungsten (W), nickel (Ni), tantalum (Ta), titanium (Ti), aluminum (Al), tantalum nitride (TaN), which has a lower standard electrode potential compared to the metal included in the first metal oxide. The standard electrode potential indicates a property in which resistance to oxidation is greater with a higher value.

In other words, the standard electrode potential V2 of the material used for the upper electrode 107, the standard electrode potential Vr2 of the metal included in the second metal oxide, the standard electrode potential Vr1 of the metal included in the first metal oxide, and the standard electrode potential V1 of the material used for the lower electrode 105 may satisfy a relationship in which Vr2<V2 and V1<V2. In addition, a relationship in which V2>Vr2 and Vr1≥V1 may be satisfied.

By adopting the above-described configuration, a redox reaction selectively occurs in the second variable resistance layer 106b, in the vicinity of the interface between the upper electrode 107 and the second variable resistance layer 106b, and thus a stable variable resistance phenomenon occurs.

Embodiment 2

Figure 3:
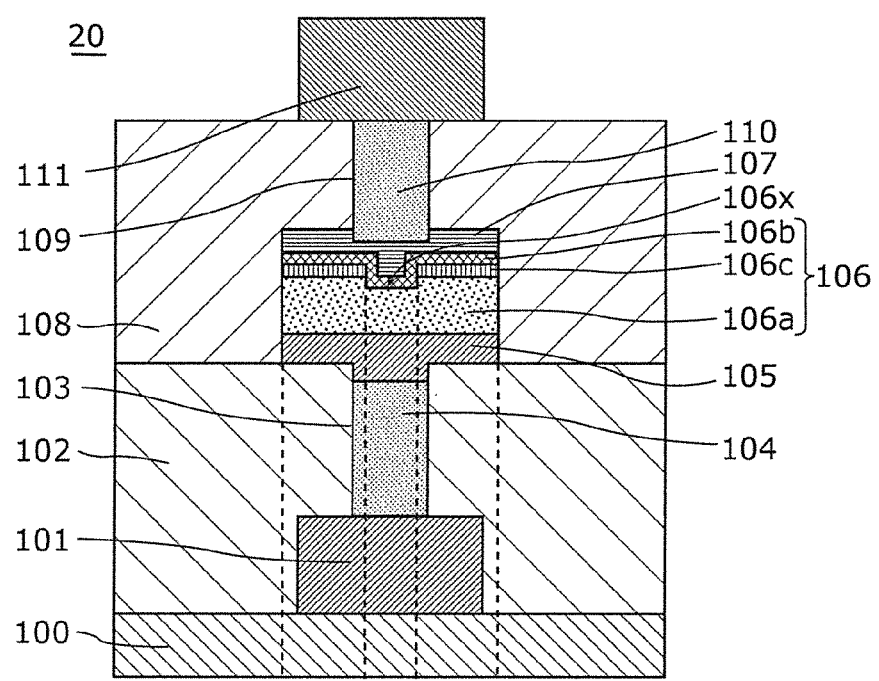
FIG. 3 (a) is a cross-sectional view of a semiconductor memory device formed through a manufacturing method in Embodiment 2, FIG. 3 (b) is a plan view of an upper electrode of the semiconductor memory device.
Figure 3:
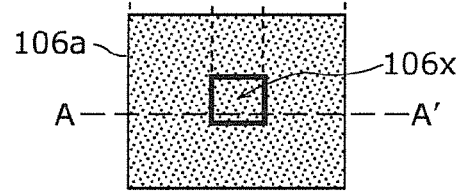

FIGS. 3 (a) and (b) respectively show an example of a cross-sectional view and a plan view of a semiconductor memory device 20 formed through a method of manufacturing a semiconductor memory device according to Embodiment 2 of the present invention. The cross-sectional view in FIG. 3 (a) corresponds to the cross section defined by a line A to A' in the plan view in FIG. 3 (b). The point of difference between the structure in this embodiment and that in Embodiment 1 is in the placement of a third variable resistance layer 106c between the first variable resistance layer 106a and the second variable resistance layer 106b.

Figure 4A:
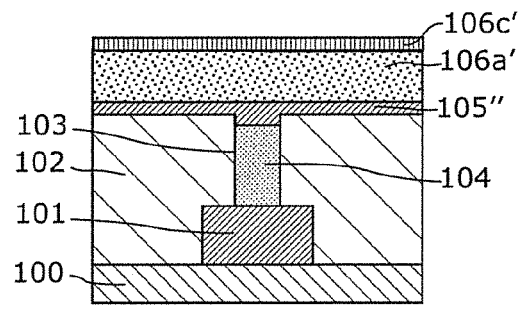
FIG. 4A is a cross-sectional view illustrating a method of manufacturing the main section of the semiconductor memory device in Embodiment 2.

FIG. 4A to FIG. 4H are cross-sectional views illustrating the method of manufacturing a semiconductor memory device in Embodiment 2 of the present invention. The manufacturing method up to FIG. 4A is the same as that shown from FIG. 2A to FIG. 2H in Embodiment 1, and thus description shall not be repeated here.

As shown in FIG. 4A, in a process of forming the first variable resistance layer 106a and the second variable resistance layer 106b, the first variable resistance layer 106a' comprising a metal oxide and a third variable resistance layer 106c' having a lower degree of oxygen deficiency than the first variable resistance layer 106a' are formed above the conductive layer 105". Both the first variable resistance layer 106a' and the third variable resistance layer 106c' are formed with what is called the reactive sputtering method in which sputtering is performed on a tantalum target in an argon and oxygen gas atmosphere.

As an example, the composition of the first variable resistance layer 106a' is $TaO_x$ ($0.8 \leq x \leq 1.9$), or at least 44.4 atm % and at most 65.5 atm % in terms of oxygen content atomic percentage), resistivity is at least 2 mΩcm and at most 50 mΩcm, and the film thickness may be at least 20 nm and at most 100 nm.

As an example, the composition of the third variable resistance layer 106c' $TaO_z$ ($2.1 \leq z \leq 2.5$, or at least 67.7 atm % and at most 71.4 atm % in terms of oxygen content atomic percentage), the resistivity may be at least to $10^7$ mΩcm, and the film thickness is at least 2 nm and at most 10 nm.

Figure 4B:
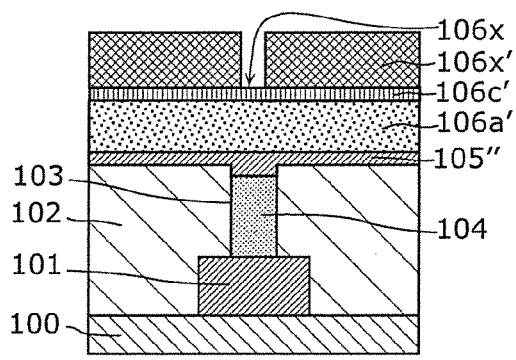
FIG. 4B is a cross-sectional view illustrating a method of manufacturing the main section of the semiconductor memory device in Embodiment 2.

Next, as shown in FIG. 4B, in a process of forming an opening in the resist 106x', after the resist 106x' is applied, an opening that reaches the third variable resistance layer 106c' is provided in a position corresponding to a step region of the resist 106x' using a photolithography technique using a desired mask.

Figure 4C:
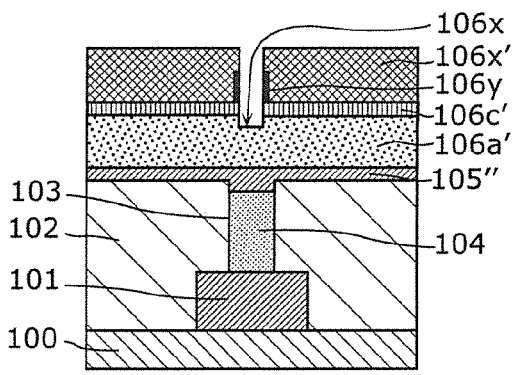
FIG. 4C is a cross-sectional view illustrating a method of manufacturing the main section of the semiconductor memory device in Embodiment 2.

Next, as shown in FIG. 4C, in a process of forming the step region 106x on the first variable resistance layer 106a', plasma-excited ions may be made to collide with the third variable resistance layer 106c' from the opening of the resist 106x' to form an opening that penetrates through the third variable resistance layer 106c'. In addition, the plasma-excited ions are made to collide with the surface of the first variable resistance layer 106a' that is exposed at the bottom of the opening, to form the step region 106x having a depth of, for example, at least 1 nm and at most 30 nm in the surface of the first variable resistance layer 106a'. In FIG. 4C, the step region 106x is exemplified as a depression formed in the first variable resistance layer 106a'. A step is formed along the edge of the step region 106x.

Since a mixed gas which does not contain fluorine (F) and has an inert gas as a primary component is used in the forming of the step region 106x, in principle, fluorine (F), and so on, does not enter the first variable resistance layer 106a' and cause deterioration of the film property of the variable resistance layer. Here, a mixed gas of chlorine with argon as the primary component is excited using plasma, and the excited ions are made to collide with the surface of the third variable resistance layer 106c' to thereby form (i) the opening that penetrates through the third variable resistance layer 106c' and (ii) the step region 106x in the first variable resistance layer 106a'. At this time, a tantalum oxide used for the sputtered third variable resistance layer 106c' and the first variable resistance layer 106a' adheres to the end face of the resist 106x' (that is, the inner circumferential face of the opening).

Figure 4D:
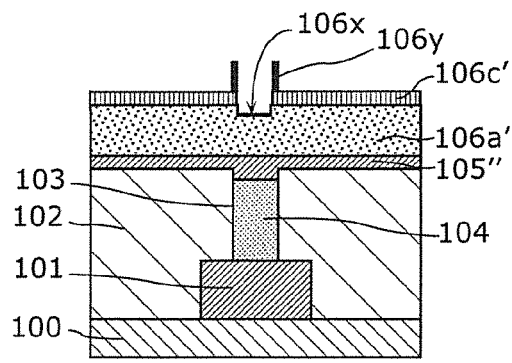
FIG. 4D is a cross-sectional view for describing a problem in a conventional method of manufacturing a semiconductor memory device as a comparative example.

When the resist is peeled off without removing this extraneous matter, the residue 106y in the form of flakes remains in the edge of the step region 106x, as shown in FIG. 4D. As pointed out in the "Technical Problem" section, the residue 106y inhibits the covering of the step by the second variable resistance layer and becomes a factor for increasing fluctuation in the initial resistance and initial break voltage of the variable resistance element.

Figure 4E:
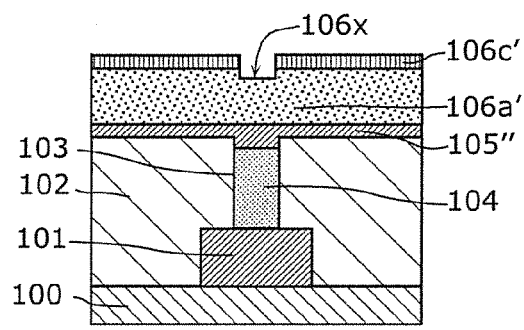
FIG. 4E is a cross-sectional view illustrating a method of manufacturing the main section of the semiconductor memory device in Embodiment 2.

Thus, in the method of manufacturing a semiconductor memory device in Embodiment 2, as shown in FIG. 4E, in a process of removing the residue 106y that has adhered in the forming of the step of the second variable resistance layer, the thin, flaky residue 106y is isotropically-etched using an ammonia hydroxide/hydrogen peroxide solution. Here, an ammonia hydroxide/hydrogen peroxide solution which is a mixture of ammonia ($NH_4OH$), hydrogen peroxide ($H_2O_2$), and water ($H_2O$), with a ratio of ammonia:hydrogen peroxide:water=1:a:b, respectively (where, $1 \leq a \leq 10$ and $1 \leq b \leq 100$). It is preferable that the etching rate of the ammonia hydroxide/hydrogen peroxide mixture solution with respect to the material used for the first variable resistance layer 106a' be adjusted to be approximately at least 0.01 nm/min and at most 1.0 nm/min. This is in order to remove the residue 106y without etching the first variable resistance layer 106a' as much as possible.

For the removing of the residue 106y, any solution capable of isotropically-etching the tantalum oxide is acceptable, and even a dilute hydrofluoric acid (DHF) solution or a dilute hydrochloric acid (HCl) solution is acceptable. Even in this case, it is preferable that the etching rate with respect the material used for the first variable resistance layer 106a' be adjusted to be approximately at least 0.01 nm/min and at most 1.0 nm/min. A chemical for removing the adhering residue may be used by being heated to, for example, 60 degrees Celsius.

Next, simultaneously with the removal of the resist 106x' using an SPM solution, dangling bonds of the surface of the exposed first variable resistance layer 106a' are terminated with oxygen. The sulfuric acid hydrogen peroxide mixture solution is a mixture of sulfuric acid ($H_2SO_4$) and hydrogen peroxide solution ($H_2O_2$), and the mixture ratio of the mixture is 1:c (where, $1 \leq c \leq 10$). Furthermore, the termination of the dangling bonds of the surface of the first variable resistance layer 106a with oxygen may be performed using hydrogen peroxide water or ozone water.

Figure 4F:
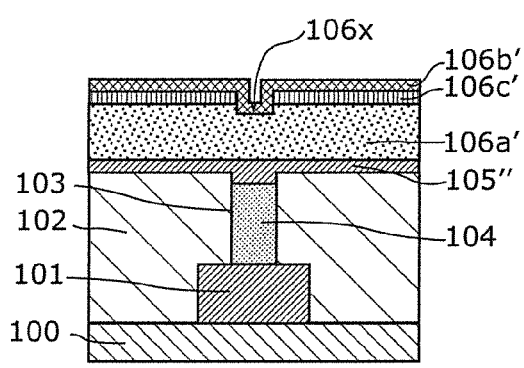
FIG. 4F is a cross-sectional view illustrating a method of manufacturing the main section of the semiconductor memory device in Embodiment 2.

Next, as shown in FIG. 4F, in a process of forming the second variable resistance layer 106b', a second variable resistance layer 106b' having a lower degree of oxygen deficiency than the first variable resistance layer 106a' is formed on the third variable resistance layer 106c'. In the same manner as in the third variable resistance layer 106c', the second variable resistance layer 106b' is formed with the reactive sputtering method in which sputtering is performed on a tantalum target in an oxygen gas atmosphere. As an example, the composition of the second variable resistance layer 106b' is $TaO_y$ ($2.1 \leq y \leq 2.5$, or at least 67.7 atm % and at most 71.4 atm % in terms of oxygen content atomic percentage), resistivity is at least $10^7$ mΩcm, and film thickness is at least 1 nm and at most 8 nm.

At this time, the second variable resistance layer 106b' is formed in the step region 106x of the first variable resistance layer 106a', and a stacked structure of the third variable resistance layer 106c' and the second variable resistance layer 106b' is formed in the region other than the step region 106x. Therefore, since the current flowing in the variable resistance element at the time of the initial break processing converges at the step region 106x where the film thickness of the variable resistance layer having a high resistance value is thin, a filament is easily formed in the step region, and lowering of the initial break voltage becomes possible.

Although the forming is performed using reactive sputtering in the above-described process, a reactive sputtering method in which sputtering is performed on a tantalum oxide target in an oxygen gas atmosphere may be used, and plasma oxidation may be performed in an atmosphere including oxygen.

Figure 4G:
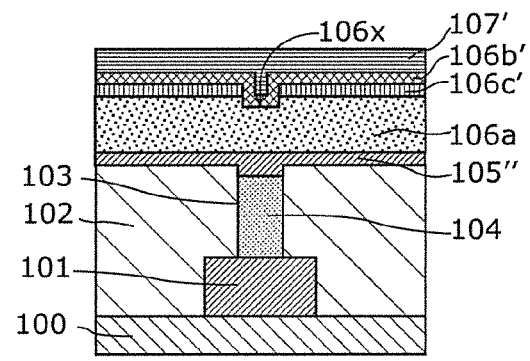
FIG. 4G is a cross-sectional view illustrating a method of manufacturing the main section of the semiconductor memory device in Embodiment 2.

Next, as shown in FIG. 4G, in a process of forming the upper electrode 107, the conductive layer 107', which comprises a noble metal (platinum, iridium, palladium, and so on) and becomes the upper electrode 107 after patterning, is formed on the second variable resistance layer 106b'.

Figure 4H:
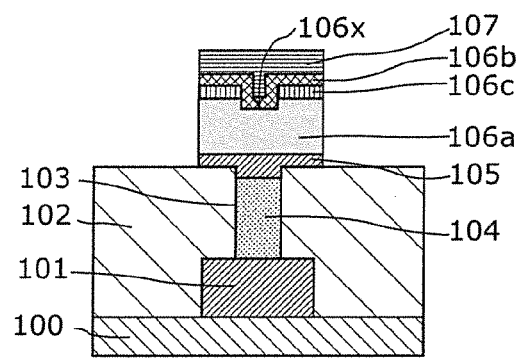
FIG. 4H is a cross-sectional view illustrating a method of manufacturing the main section of the semiconductor memory device in Embodiment 2.

Next, as shown in FIG. 4H, in a process of forming the variable resistance element, patterning using the desired mask is performed on the conductive layer 105'', the first variable resistance layer 106a', the third variable resistance layer 106c', the second variable resistance layer 106b', and the conductive layer 107' shown in FIG. 4G to form the variable resistance element in which the variable resistance layer 106 configured of the stacked 2 layers of the first variable resistance layer 106a and the second variable resistance layer 106b above the step region 106x, and the stacked 3 layers of the first variable resistance layer 106a, the third variable resistance layer 106c, the second variable resistance layer 106b in the region other than the step region 106x, is held between the lower electrode 105 and the upper electrode 107. Since etching is difficult to perform on a noble metal and the like which is representative of materials having high standard electrode potential, when a noble metal is used for the upper electrode, the variable resistance element can also be formed with the upper electrode as a hard mask. Although, in the present process, patterning is performed collectively using the same mask, patterning may be performed on a per layer basis.

Lastly, the second interlayer insulating layer 108 (for example, thickness: at least 500 nm and at most 1000 nm) is formed covering the variable resistance element, and the second contact hole 109 and the second contact plug 110 are formed according to the same manufacturing method as in FIG. 2B and FIG. 2C. Subsequently, the second line 111 is formed covering the second contact plug 110, and the semiconductor memory device 20 shown in FIG. 3 (a) is completed.

With the above-described manufacturing method, the residue at the time of step-forming can be removed, and thus fluctuation in initial resistance value and fluctuation in initial break voltage are suppressed. In addition, in Embodiment 2, because the adoption of a configuration which places the third variable resistance layer 106c between the first variable resistance layer 106a and the second variable resistance layer 106b allows the film thickness of the high-resistance layer such as the step region to be made thin, there is the effect of narrowing down the filament forming region. Therefore, compared to the configuration in Embodiment 1, it is possible to guide the forming of the filament to the step region and suppress the fluctuation in initial break voltage. Furthermore, by terminating the dangling bonds of the surface of the first metal oxide with oxygen after the residue removal, the fluctuation in the initial resistance value is further reduced and the suppression of initial break voltage fluctuation can be improved. Therefore, lowering the initial break voltage and suppressing fluctuation therein can both be achieved, and miniaturization and increased capacity of memories can be realized.

Although embodiments of the present invention have been described thus far, the present invention is not limited to Embodiments 1 and 2 described earlier, and the present invention also includes those methods of manufacturing a semiconductor memory device that are realized by carrying out various modifications that may be conceivable to a person of ordinary skill in the art or by arbitrarily combining the components of the exemplary embodiments.

For example, although the case in which the step region 106x is a depression in the first variable resistance layer 106a' is exemplified in the embodiments, the step region 106x may be formed in a shape other than a depression.

Figure 7:
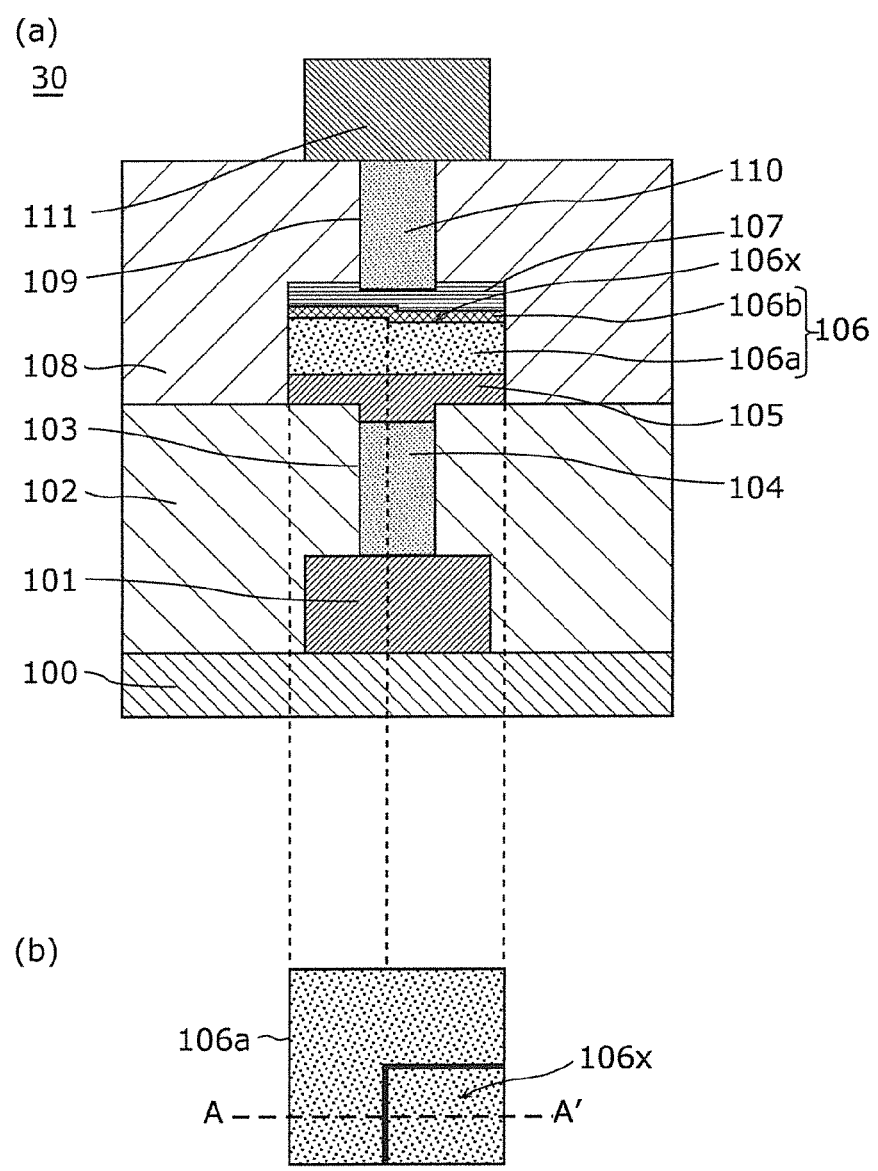
FIG. 7 (a) is a cross-sectional view of a semiconductor memory device according to a modification in the present invention, FIG. 7 (b) is a plan view of an upper electrode of the semiconductor memory device.

For example, as in a semiconductor memory device 30 shown in the cross-sectional view in FIG. 7 (a) and the plan view in FIG. 7 (b), the step region 106x may be a cut out formed in a corner (as an example, a region approximately ¼ of the upper surface and equivalent to the lower right in FIG. 7 (b)) of the top face of the first variable resistance layer 106a. In this case, the edge of the step region 106x forms an L-shape as seen in the plan view in FIG. 7 (b), and the step is formed along this L-shape. Furthermore, although not shown in the figure, a region that is approximately half of the top face of the first variable resistance layer 106a may be cut out as the step region 106x.

Figure 8:
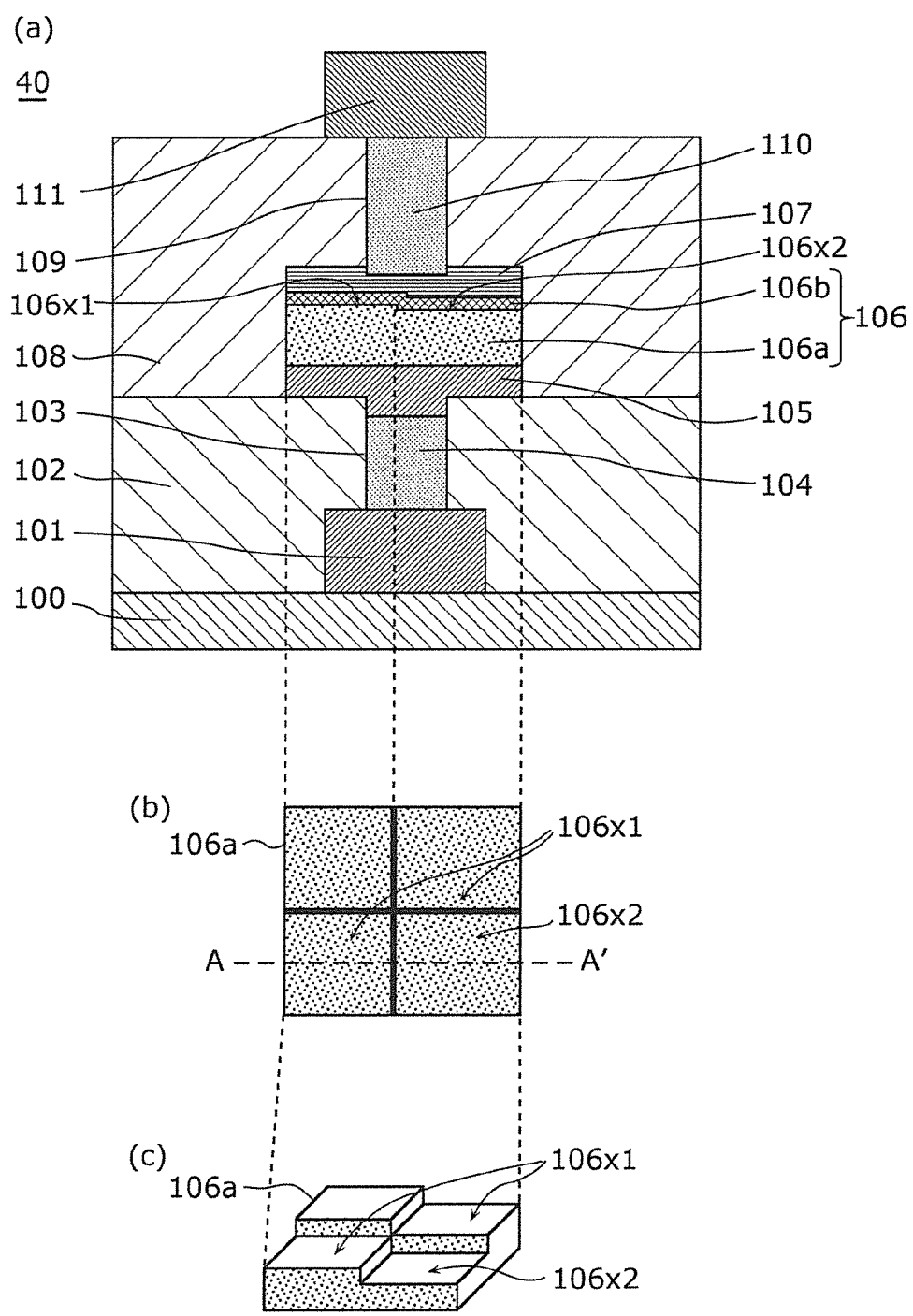
FIG. 8 (a) is a cross-sectional view of a semiconductor memory device according to a modification in the present invention, FIG. 8 (b) is a plan view of an upper electrode of the semiconductor memory device, FIG. 8 (c) is a perspective view of the upper electrode of the semiconductor memory device.

Moreover, as in a semiconductor memory device 40 shown in the cross-sectional view in FIG. 8 (a), the plan view in FIG. 8 (b), and the perspective view in FIG. 8 (c), a step region 106x1 in a first stage and a step region 106x2 in a second stage lower than the step region 106x1 may be formed in the top face of the first variable resistance layer 106a'. The edge of the step regions 106x1 and 106x2 in this case forms a cross-shape as seen in the plan view in FIG. 8 (b), and steps are formed along this cross-shape.

INDUSTRIAL APPLICABILITY

The present invention provides a method of manufacturing a variable resistance semiconductor memory device, and is useful in various electronic devices that use a nonvolatile memory because the present invention can realize a nonvolatile memory which operates in a stable manner and is highly reliable.

REFERENCE SIGNS LIST 10, 20, 30, 40 Semiconductor memory device
100 Substrate
101 First line
102 First interlayer insulating layer
103 First contact hole
104 First contact plug
104' Conductive layer which becomes the first contact plug
105 Lower electrode
105', 105" Conductive layer which becomes the lower electrode
106 Variable resistance layer
106a, 106a' First variable resistance layer (low oxygen content layer, low resistance layer)
106x, 106x1, 106x2 Step region formed in the top face of the first variable resistance layer
106x' Resist applied on the top face of the first variable resistance layer
106y Residue
106b, 106b' Second variable resistance layer (high oxygen content layer, high resistance layer)
106c, 106c' Third variable resistance layer (high oxygen content layer, high resistance layer)
107 Upper electrode
107' Conductive layer which becomes the upper electrode
108 Second interlayer insulating layer
109 Second contact hole
110 Second contact plug
111 Second line

The invention claimed is:

1. A method of manufacturing a semiconductor memory device, comprising:
    forming a lower electrode above a substrate;
    forming a first variable resistance layer above the lower electrode, the first variable resistance layer comprising a first metal oxide;
    forming a step in a top face of the first variable resistance layer by causing ions excited by plasma to collide with a part of the top face of the first variable resistance layer;
    removing residue of the first variable resistance layer remaining on the step, after the step is formed;
    forming a second variable resistance layer covering the step of the first variable resistance layer, after the residue is removed, the second variable resistance layer comprising a second metal oxide having a degree of oxygen deficiency lower than a degree of oxygen deficiency of the first metal oxide and having a bend on a surface above the step;
    forming an upper electrode above the second variable resistance layer;
    forming a third variable resistance layer above the first variable resistance layer before the step is formed, the third variable resistance layer comprising a third metal oxide having a degree of oxygen deficiency lower than a degree of oxygen deficiency of the first metal oxide, and
    wherein, in the forming of a step, the step is formed by forming an opening penetrating through the third variable resistance layer by causing the ions to collide with a part of a top face of the third variable resistance layer, and causing the ions to collide with the first variable resistance layer exposed at a bottom of the opening, the part being located above the part of the top face of the first variable resistance layer.

2. The method of manufacturing a semiconductor memory device according to claim 1,
    wherein, in the forming of a step, the part of the top face of the first variable resistance layer is removed through collision with the ions, and the step is formed at a border between the removed part of the top face of the first variable resistance layer and a remaining part of the top face that is not removed.

3. The method of manufacturing a semiconductor memory device according to claim 1,
    wherein, in the forming of a step, the collision with the ions is performed in an inert gas or a mixed gas which has an inert gas as a primary component and does not contain fluorine.

4. The method of manufacturing a semiconductor memory device according to claim 1,
    wherein, in the removing of residue, the residue is etched using a solution including any of ammonia, fluorine, and chlorine.

5. The method of manufacturing a semiconductor memory device according to claim 1, further comprising
    terminating dangling bonds of the first metal oxide with oxygen, after the residue is removed.

6. The method of manufacturing a semiconductor memory device according to claim 5,
    wherein in the terminating of dangling bonds with oxygen, the dangling bonds of the first metal oxide are terminated using a solution including either hydrogen peroxide or ozone.

7. The method of manufacturing a semiconductor memory device according to claim 1,
    wherein the residue remains as flakes on the step, after the step is formed.

* * * * *